United States Patent [19]

Bartelink

[11] Patent Number: 4,510,516
[45] Date of Patent: Apr. 9, 1985

[54] THREE-ELECTRODE MOS ELECTRON DEVICE

[76] Inventor: Dirk J. Bartelink, 391 San Domingo Way, Los Altos, Calif. 94022

[21] Appl. No.: 343,954

[22] Filed: Feb. 1, 1982

[51] Int. Cl.³ .......................................... H01L 27/14
[52] U.S. Cl. .................... 357/23.1; 357/23.2; 357/23.6; 357/23.7; 357/23.14; 357/14; 357/49
[58] Field of Search ................. 357/23.1, 23.6, 23.14, 357/23.2, 14, 49, 23.7

[56] References Cited
U.S. PATENT DOCUMENTS 3,384,792  5/1968  Kazan et al. ................... 357/23.7 X
3,602,982  9/1971  Kooi ................................... 357/49 X
3,808,472  4/1974  Engeler ............................. 357/14 X

*Primary Examiner*—Andrew J. James
*Assistant Examiner*—W. Mintel
*Attorney, Agent, or Firm*—Thomas Schneck

[57] ABSTRACT

An electron device resembling a MOS capacitor with two opposed terminals, except that the central dielectric substance includes a centralsemiconductor layer connected to a third terminal. An information carrying signal traveling depthwise through the layers is controlled by the variation of the depletion layers that are formed depthwise opposite each other by the action of the top and bottom electrodes. This control action takes the form of modulation of displacement current in the central dielectric substance. Pulse edge biasing of the device can cause two opposed depletion layers to approach each other in the central semiconductor layer achieving punch-through. An inverter circuit, formed by a pair of these devices forms the basis for a logic family. A transmission line, an EAROM, and a single-cell static random access memory are integrated circuit applications of the device.

21 Claims, 25 Drawing Figures

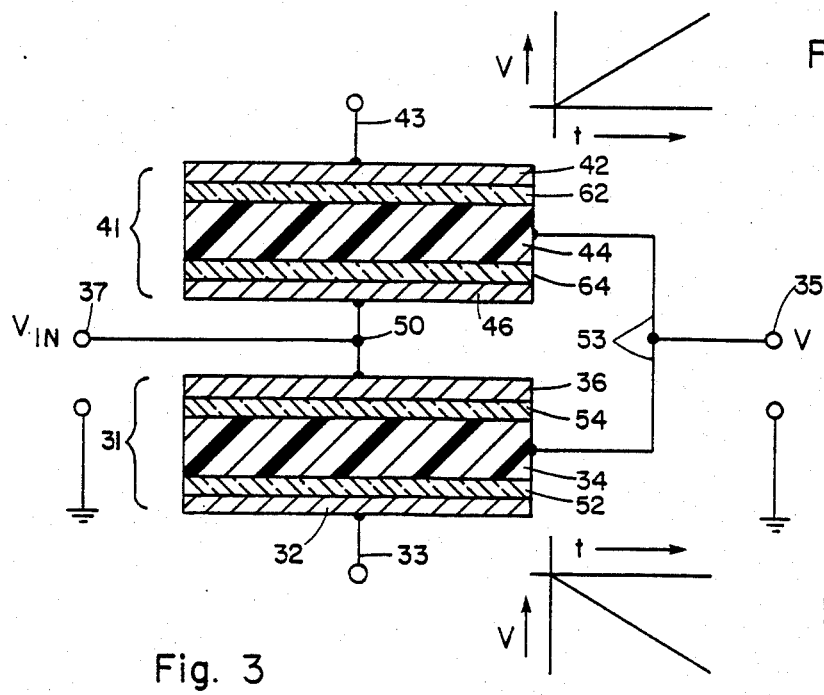
Fig. 4a
Fig. 4b
Fig. 3
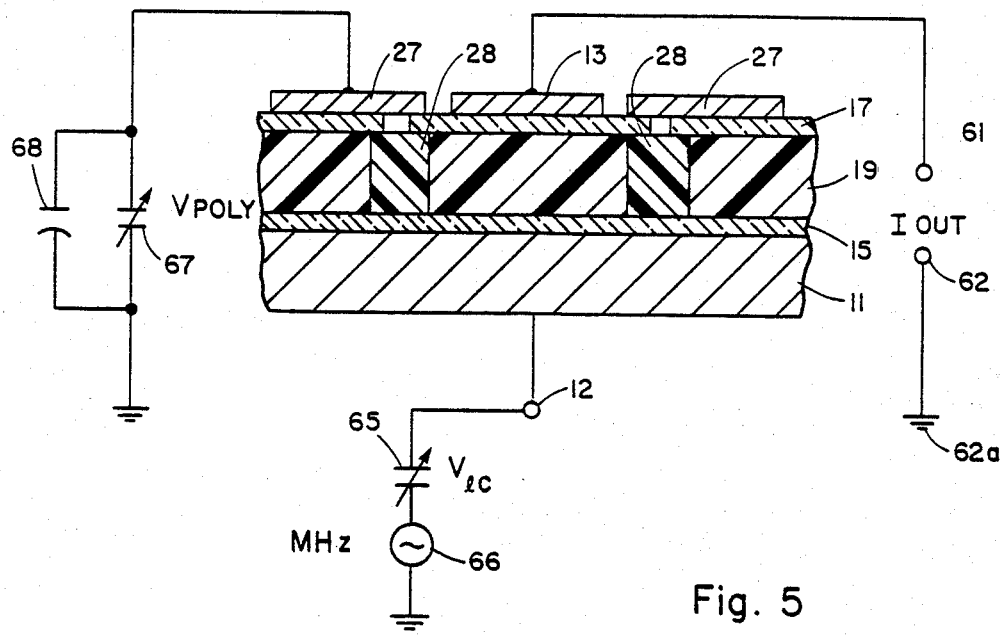
Fig. 5

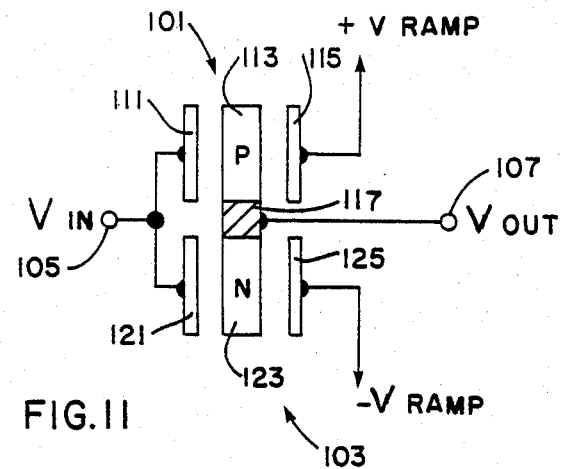
FIG. 11
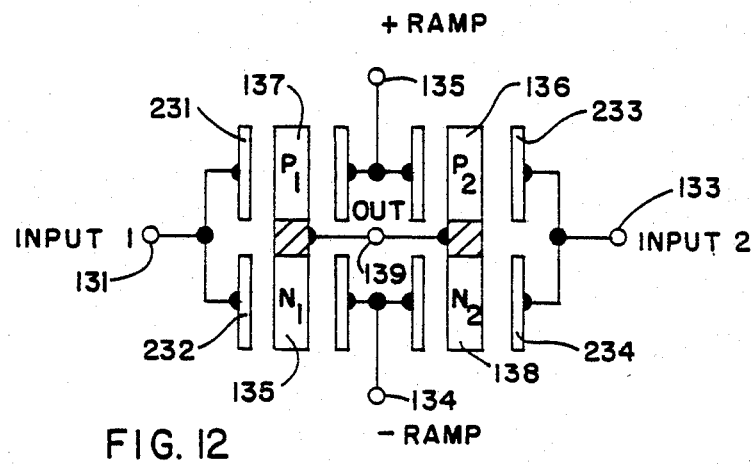
FIG. 12
| STATE | INPUT 1 | INPUT 2 | OUTPUT | ALTERNATE OUTPUT |
|---|---|---|---|---|
| 1 | P | P | N | N |
| 2 | N | N | P | P |
| 3 | N | P | P | N |
| 4 | P | N | P | N |
FIG. 13

THREE-ELECTRODE MOS ELECTRON DEVICE

DESCRIPTION

1. Technical Field

The invention relates to electron devices and in particular to a three-electrode metal oxide semiconductor (MOS) device for use in digital and analog circuits.

2. Background Art

Fixed and variable capacitors are well known charge storage elements. Certain semiconductor diodes, known as varactors, have a non-linear reverse-bias capacitance which makes them useful in applications such as high frequency modulators in microwave circuits. See "Physics of Semiconductor Devices" by S. M. Sze, Wiley (1969) pp. 133-136. Switched capacitors are used extensively in analog integrated circuits. See "Analog MOS Integrated Circuits," Edited by P. R. Gray, P. A. Hodges and R. W. Brodersen, IEEE Press Selected Reprint Series, Wiley, New York (1980).

MOS capacitors are well known in the fabrication of MOS and MIS structures and devices. Such capacitors consist of a semiconductor layer having a major surface, a dielectric insulating layer disposed on the major surface and a conductive layer thereon which corresponds to the gate of an MOS transistor. A useful aspect of MOS capacitors arises from capacitance-voltage variations, known as C-V characteristics, which are important in the fabrication of MOS transistors. An explanation of MOS capacitors and their utility is contained in the book "MOS/LSI Design and Application," by W. N. Carr and J. P. Mize, McGraw Hill, 1972, page 42 ff. The book explains that MOS capacitors are sometimes incorporated in MOS circuit chips for the purpose of monitoring the fabrication process.

MOS capacitors are often used as charge storage nodes in memory circuits. The voltage-variable capacitance of two-electrode MOS capacitors has been used in high frequency varactor amplifiers and tuning circuits. The accurately fabricated capacitance value of MOS capacitors has made them useful in switched capacitor circuits. Thin films of silicon have been prepared by laser and electron beam recrystallization and lateral epitaxial growth.

One of the problems associated with MOS transistors is slower speed, compared to bipolar transistors. Other than speed, MOS transistors are preferred because of simplicity of construction and superior electrical properties for many applications. An object of the invention is to devise an MOS device comparable in utility and speed to bipolar transistors, but having a more compact geometry than present MOS transistors. Another object is to devise an MOS device having low power dissipation characteristics typical of capacitors and having electric properties comparable to MOS transistors.

DISCLOSURE OF INVENTION

The present invention structurally resembles the vertically stacked layers of an MOS capacitor, except that the dielectric material between the two electrodes is itself a composite containing an electrode, so that the circuit element has three electrodes and has properties resembling a two-port, three-electrode device, such as a transistor. This hybrid device has been named a transpacitor. Such a device is characterized in a two-dimensional current-voltage plot by a family of curves. The essential difference between a transistor and a transpacitor of the present invention is that the output of a transistor is based upon the modulation of particle current, whereas the present invention relies upon the modulation of displacement current in a dielectric material.

Schematically, a transpacitor device has five vertical, generally planar layers, not including an insulating substrate which may optionally be utilized. The lowermost layer is a conductive planar layer which may be a highly doped semiconductor or metal layer. Next is a composite dielectric sandwich consisting of a thin oxide or nitride layer, an electrically thin semiconductor layer, overlaid by another thin oxide or nitride layer. The central semiconductor layer is an electrode. Over the composite dielectric sandwich is a conductive layer, usually metal, or heavily doped polycrystalline semiconductor.

Prior art MOS transistors usually have a lateral construction in the sense that drain, source and gate regions are designed in the upper surface of the semiconductor. On the other hand, the present invention employs a compact depthwise, as opposed to a space-consuming lateral, geometry in the same way that an MOS capacitor does.

An advantage of building a three-electrode MOS device with a depthwise structure is that the information-carrying signal current travels depthwise through the layers. It is controlled by the variation of the depletion layers that are formed depthwise opposite each other by the action of the top and bottom electrodes. This control action takes the form of a modulation of the displacement current in contradistinction to the control of particle current in prior art transistors.

To understand this displacement current modulation in isolation from the specific method of its implementation, consider an air dielectric parallel plate capacitor. As is well known, a signal may be passed through this device by varying the voltage on one of the plates and sensing the current that is caused to flow through the conducting circuit attached to the other plate. Three-electrode action is achieved by inserting a third electrode between the plates. If that electrode is a conductor which is grounded, the signal passing between the plates is inhibited by the well-known Faraday screening effect. If that electrode is converted to a dielectric on the other hand, the signal is not significantly impeded. Conversion of that electrode from a conductor to a dielectric and vice versa, is achieved by depletion or accumulation of electrical charge on the thin semiconductor layer of the composite dielectric sandwich of the transpacitor described herein.

A second advantage of the invention is that there is very little power dissipation associated with the signal flow through the transpacitor. This is due principally to the capacitive nature of the device in its quiescent state.

A third advantage of the transpacitor of the present invention is that it has a characteristic high switching speed associated with the modulation of depletion layer width as is known in varactor diodes.

The transpacitor may serve as a signal modulator, without gain, or may be used in other ways with gain, such as in an inverter circuit. An inverter stage is formed by two matched devices connected back-to-back.

BRIEF DESCRIPTION OF DRAWINGS

FIG. 3 is an electrical circuit of two transpacitors connected back-to-back for use as an inverter.

FIGS. 4a and 4b are electrical diagrams explaining use of the device of FIG. 1.

FIG. 5 is a circuit diagram of a test set-up for the device of FIG. 1.

FIG. 11 is a schematic view of an inverter circuit having a side-by-side configuration.

FIG. 12 is a combination of two inverter circuits, forming a NOR gate.

FIG. 13 is a state table for the NOR gate of FIG. 12.

BEST MODE FOR CARRYING OUT THE INVENTION

Figure 1:
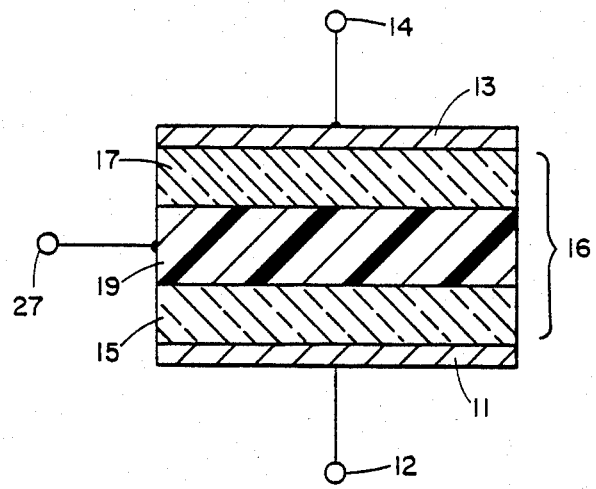
FIG. 1 is a schematic cross sectional view of a transpacitor in accord with the present invention.

FIG. 1 is a schematic representation of the present invention. The schematic resembles an MOS capacitor with a first conductive planar electrode 11, usually a metal layer, or heavily doped semiconductor layer having an upper major surface for supporting other layers, a second conductive electrode 13, opposite the first electrode, also usually a metal layer, a dielectric sandwich 16, between the first and second electrodes. The dielectric sandwich includes a planar first oxide or nitride layer 15 which is disposed on the first electrode 11, a layer of semiconductor material 19 on top of layer 15 and a second planar oxide or nitride layer 17 on top of semiconductor material layer 19, so that layer 17 is adjacent to second electrode 13. Layer of semiconductor material 19 may be single-crystalline or polycrystalline, lightly doped silicon. It will be noted that semiconductor material layer 19 has a third electrode terminal 27, similar to first and second terminals 12 and 14 associated with electrodes 11 and 13 respectively. To each of the terminals 12, 14 and 27, bias and/or signal voltages may be applied.

Figure 2:
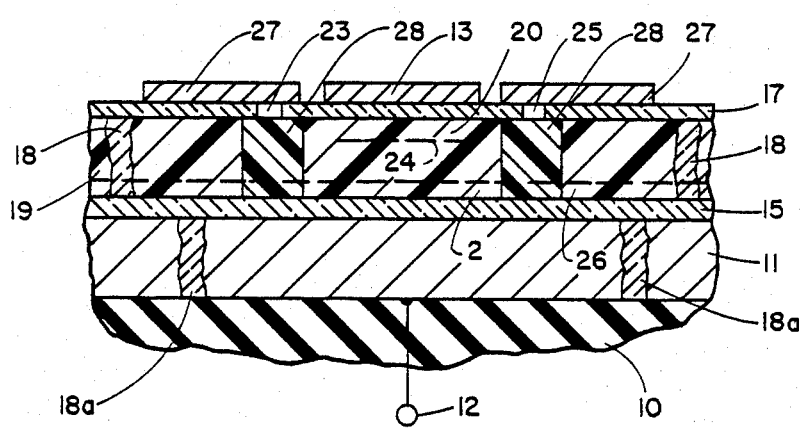
FIG. 2 illustrates an MOS cross sectional construction for the device of FIG. 1.

The MOS construction of this device may be seen with reference to FIG. 2, a cross-sectional view. The device is fabricated on an insulating substrate 10, a material of design choice. The substrate usually has a planar surface for formation of a conductive electrode 11 over the surface. This electrode may be highly doped silicon or metal which can be segmented by cuts 18a with different segments used for different circuits or functions. Contact is made electrically with an electrical terminal 12 either through the backside of the device or through its edge. This conductive layer is also planar, having a major surface generally parallel to the surface of the insulating substrate 10. Over the layer 11 is disposed a first thin oxide or nitride layer 15, such as $SiO_2$ or other, which is a thermal oxide or nitride layer of the conductive layer's semiconductor material and could be other types of insulating layers. Next, a lightly doped semiconductor layer 19 is disposed over the insulating layer 15. This layer is the principal controlling electrode element of the present invention. The semiconductor layer 19 is preferably crystallized semiconductor material, having a single crystal or large grain-size structure. The layer is lightly doped and is electrically thin, meaning that two opposite depletion regions can reach each other at common transistor voltages, i.e. 1–10 volts as an order of magnitude approximation.

The "effective thickness" of semiconductor layer 19 is a physical or actual thickness related to the ability to create opposed deletion layers which will touch each other in the material, the layers being created at reasonable voltages. Voltages exceeding the limit set by surface inversion are achieved by dynamic operation when voltage is applied at a faster rate than the time constant for the formation of the inversion channel. Typically, such an actual thickness will be somewhat thicker than the thickness of a dielectric in an MOS capacitor such as, for example, 0.5 micrometers.

A second oxide or nitride layer 17 is disposed over the silicon layer. This layer may be $SiO_2$ or other oxide or nitride layer and may advantageously be thermally grown from the silicon layer 19. This layer may be masked and etched forming cuts 23 and 25 so that a metal ring electrode 27 may contact the semiconductor 19 in the cut regions. These cut regions where electrical contact occurs with ring electrode 27 are highly doped zones, for example an ion implanted or diffused annulus 28 of the same conductivity type as the semiconductor layer. Besides this contact approach, terminal contact with semiconductor layer 19 could be by edge contact with this layer or by a buried path through the top or bottom of the device. The device may be isolated from the remaining layer by island definition through cuts 18. The second electrode 13 does not make contact with the semiconductor layer 19, but overlays insulating layer 17, serving as the upper electrode of the MOS structure. The voltage on second electrode 13, together with that on first electrode 11, modulates displacement current, by forming depletion zones 20 and 22 in semiconductor layer 19. The depletion zones are indicated by dashed lines 24 and 26, respectively.

Operation of the device as an active element is understood as follows: consider a transient voltage applied between electrode 13 and the surrounding metal ring electrode 27. When this voltage is superimposed on a bias voltage which at some time is changed to become large enough to cause depletion across the full thickness of semiconductor layer 19, the conducting path connecting the ring electrode 27 to the interior portion of semiconductor layer 19 will effectively be disconnected. The electric field lines coming from electrode 13 that formerly went to semiconductor layer 19 and thereby completed a circuit to ring electrode 27 will now penetrate the semiconductor layer to the conductive layer 11 where they then complete a circuit. This operation is known as "punch-through," representing a fully transmitting stage of the transpacitor of the present invention for a.c. signals. Note that terminal contact with semiconductor layer 19 need not be through openings in the uppermost insulating layer 17. Instead, the insulating layer 17 could be continuous with an overlying continuous metal electrode 13.

With reference to FIG. 3 a pair of transpacitors, 31 and 41, are shown schematically to be connected in series, forming an inverter circuit. Although they are shown as physically stacked one above the other, transpacitors 31 and 41 could also be placed adjacent to each other and could both be constructed from the same basic five layers with selective doping and etching. Transpacitor 31 has a first electrode 32 connected to terminal 33, a lightly doped semiconductor layer 34, preferably n-silicon terminating in an output terminal 35. Semiconductor member 34 is sandwiched between oxide or nitride layers 52 and 54. A second conductive electrode 36 is connected to input terminal 37.

Transpacitor 41 is matched in construction and performance characteristics with transpacitor 31, except that the doping of the central, lightly doped, semiconductor layer 44 is of the opposite type relative to semiconductor layer 34. A first planar electrode 42 is connected to terminal 43. The lightly doped semiconductor 44, sandwiched between oxide or nitride layers 62 and 64, is connected to output terminal 35 in common with semiconductor electrode 34 of transpacitor 31. The other conductive layer 46 shares input electrode 37 with conductive layer 36, joined at node 50. Bypass loop 53 connects semiconductor electrode 44 to semiconductor electrode 34.

FIGS. 4a and 4b represent the leading edge or rising transition of a square wave or clock pulse which serves to supply bias voltage to the transpacitor pair. The same pulse is applied to bias terminals 33 and 43, except that the pulse applied at terminal 33 is the opposite polarity, but generally the same amplitude, as the pulse applied at terminal 43. If the devices have less than ideally matched characteristics, the voltage amplitudes and rise times can be adjusted to compensate. These pulse transition waveforms are referred to as a ramp voltage even though the ramps may be quite steep. In the balanced condition represented by the proper pulse amplitudes and the absence of an input voltage, $V_{in}$, the output voltage $V_{out}$, on terminal 35 will tend to remain close to zero voltage, at least during the initial stages of the voltage ramps in FIGS. 4a and 4b. The current between the pulse supplies is carried by the shorting link 53 of the semiconductor layers 34 and 44 while these remain undepleted. If $V_{in}$ is made slightly negative during the progress of the ramp, the lower transpacitor 31 will have a slightly reduced capacitance compared to the upper transpacitor 41. This comes about because the negative $V_{in}$ adds to the depletion effect of the lower transpacitor while it contributes an amount of accumulated charge to upper transpacitor 41. There is an initial regenerative effect which magnifies the instability caused by an unbalance of the two transpacitors due to the input signal. If the output node 35 is connected to a reasonably high impedance load, the output node 35 will be free to follow the unequal voltage divider action imposed on it by the two transpacitors to a positive voltage. (This action occurs whenever two complementary n- and p-type MOS capacitors are properly series-connected to balanced voltage ramps.) The voltage of the midpoint will diverge in the direction of the initial departure from the balance point.

While the semiconductor layer 34 is starting to deplete through, the displacement current associated with the lower ramp of FIG. 4b will terminate on the input node 37 instead of the semiconductor layer 34. Because of this change, semiconductor layer 44 is being driven toward more positive voltage and thus more charge accumulation by its connection through loop 53. As time progresses, semiconductor layer 34 is depleted throughout. The output voltage at terminal 35 will more closely follow the ramp of FIG. 4a than that of FIG. 4b and reach a voltage determined by the voltage divider composed of the two transpacitors in series, one with a depleted semiconductor layer 34, the other with an undepleted layer 44. The value will be roughly one half the ramp voltage of FIG. 4a unless the ramp voltages are above some critical value. Moreover, if output node 35 is connected to a load impedance that is too low, semiconductor layer 44 can also deplete through, in which case the output will be limited at a smaller value. The overall effect of the small negative input voltage is a large positive output voltage, thus representing useful gain.

It can be seen that there is a steering of current between terminal 43 and terminal 33. In the balanced condition, current flows from terminal 43 into semiconductor layer 44 through shorting link 53 to layer 34 and then to terminal 33. In the fully unbalanced condition, current flows from terminal 43 directly to terminal 33. Between the balanced and the unbalanced condition, there is a gradual diminution in the current through the shorting link. The polarity of the input signal, $V_{in}$, determines which semiconductor layer depletes, thereby determining the polarity of the output signal. Secondly, the presence of an input signal increases the speed at which the change in current steering occurs. Thirdly, the input signal assists the non-depletion of one of the semiconductor layers, thereby improving the level of the output signal, $V_{out}$.

Figure 6:
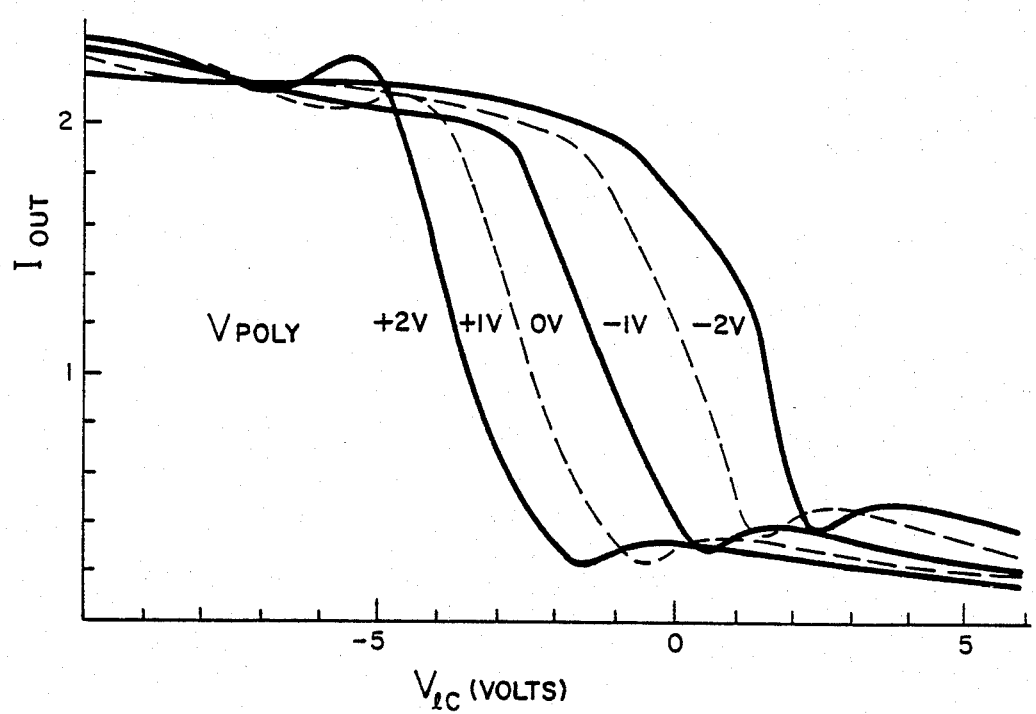
FIG. 6 is a plot of current versus voltage for the device of FIG. 1 using the test set-up illustrated in FIG. 5.

FIG. 5 shows a test set-up for measuring characteristic curves illustrated in FIG. 6. A single transpacitor of the type illustrated in FIG. 2 is shown in simplified plan view. First conductive layer 11, having first terminal 12 is shown to be spaced from semiconductor layer 19 by oxide or nitride layer 15. Semiconductor layer 19 is connected to metal ring electrode 27 by the ion-implanted or diffused annulus 28, making ohmic contact between semiconductor layer 19 and ring electrode 27. Second electrode 13 is shown to be in a spaced capacitive relation relative to first electrode 11 and connected to an output terminal 61. A second output terminal, 62 is connected to ground 62a. The terminal 12, associated with first electrode 11 is connected to a variable d.c. voltage supply 65, known as $V_{lc}$, the letters "lc" standing for lower conductor. A 1 MHz small signal a.c. source 66 is connected in series with variable supply 65 so that an a.c. signal can be superimposed on the d.c. signal generated by variable supply 65. Ring electrode 27 is connected to a variable d.c. supply 67 which is shunted by a high value capacitor 68, having the purpose of providing an a.c. ground to semiconductor layer 19. The variable voltage supply 67 is known as $V_{poly}$, since in early experiments polysilicon was used as the semiconductor material of semiconductor layer 19. In the measurement of FIG. 6, the output current $I_{out}$ was measured by a low impedance meter as a function of $V_{lc}$ for different fixed values of $V_{poly}$.

The inverter circuit of FIG. 3 is but one application for the transpacitor of the present invention. The inverter circuit is significant because it has gain, but other circuits, known in semiconductor technology could also be built where the advantage is of compact geometry, low power dissipation and electrical properties comparable to MOS transistors are desired.

Figure 7:
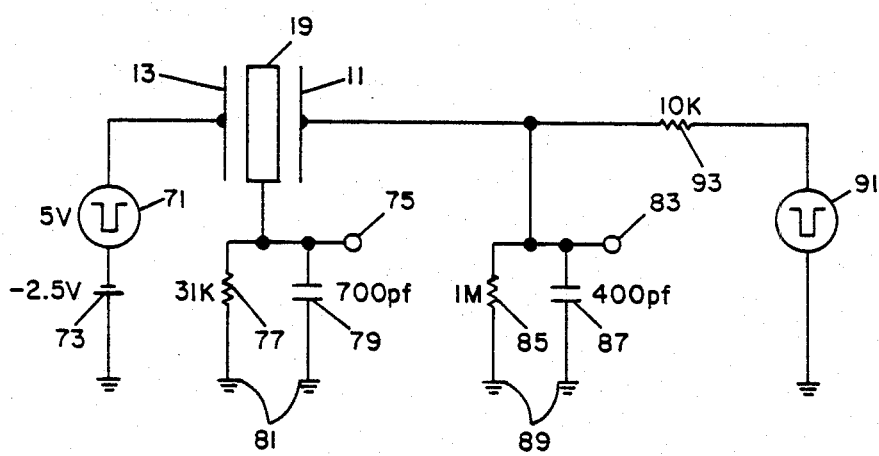
FIG. 7 is a circuit diagram of another test set-up for the device of FIG. 1.

The test set-up shown in FIG. 7 was used to demonstrate the switching or steering characteristics of the transpacitor illustrated in FIG. 1. The upper metal electrode 13 is connected to an input pulse source 71 and a d.c. supply 73. The semiconductor electrode 19 is connected to a test point 75 which is intermediate of a resistor 77 and a capacitor 79, joining the dielectric electrode to ground 81.

The lower electrode 11 is connected to a second test point 83 intermediate of the electrode 11 and a high resistance 85 and a capacitor 87, the other sides of which are connected to ground 89. A control voltage is applied from a supply 91, connected on the distant side of resistor 93.

Figure 8:
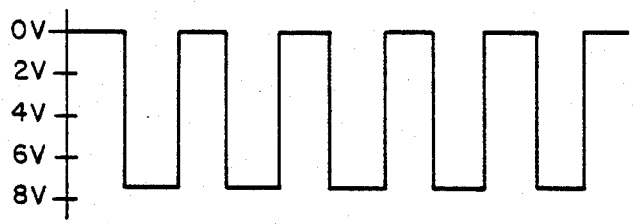
FIG. 8 is a plot of voltage versus time of an input waveform used in the test set-up of FIG. 7.
Figure 9A:
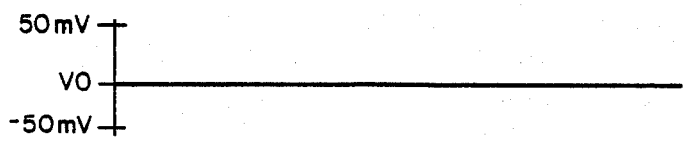
FIGS. 9a, 9b, 10a and 10b are output waveforms observed in the test set-up of FIG. 7, using the waveforms of FIG. 8.
Figure 9B:
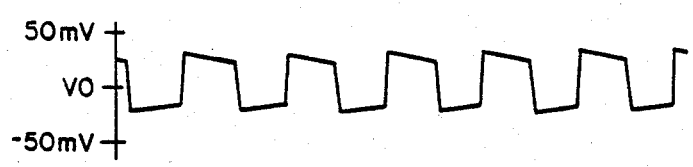

The input waveform applied to signal source 71 is illustrated in FIG. 8. The period of the pulses is one microsecond. If the control voltage applied at source 91 is zero volts, the waveform observed at test point 75 is indicated in FIG. 9a, while the waveform observed at test point 83 is illustrated in FIG. 9b. The conclusion reached under this test condition is that there is no Faraday screening effect since the input voltage on electrode 13 is transmitted to electrode 11. Under this test condition the transpacitor behaves as a simple capacitor with semiconductor electrode 19 in a depleted state with the output voltage having a magnitude expected from the capacitor ratios.

Figure 10A:
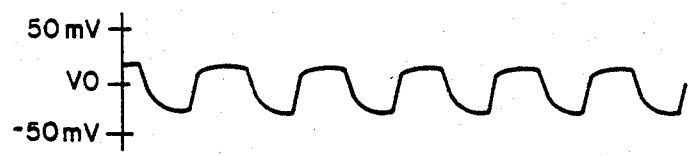
Figure 10B:
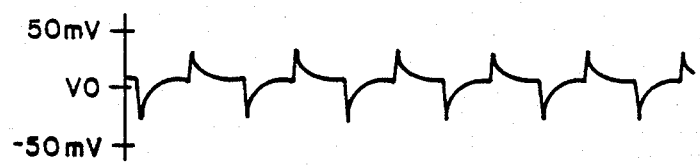

FIGS. 10a and 10b illustrate a test condition when a −5 volts is applied as the control voltage at source 91. Under this test condition, the semiconductor electrode 19 has charge accumulated along its length and acts as a Faraday screen to prevent input transitions from reaching electrode 11.

In FIG. 10a it is seen that at test point 75 the electrode 19 follows the input waveform. Now, however, at test point 83, the lower electrode 11 is screened from the input electrode 13, as shown in FIG. 10b, except for some slight leakage which results from the particular construction of the device used. It can be reduced significantly with improved construction techniques and smaller dimensions.

In making these measurements, it has been observed that semiconductor layer 19 and lower layer 11 in combination behave as an RC transmission line which was 25 micrometers in length in their example. The energy storage properties of a transmission line act to slow down the operation of the device but shortening this line will reduce the transition time in proportion to the square of its length.

TRANSPACITOR LOGIC

Transpacitor logic is based on the operation of a NOR gate which is formed from two transpacitor inverters connected together. The operation of the NOR gate requires a more detailed understanding than already given of the instability mechanisms operative in the inverter.

The circuit of FIG. 11, which electrically corresponds exactly to the circuit of FIG. 3, shows a pair of complementary transpacitors 101 and 103. Both transpacitors share a common input terminal 105 and an output terminal 107. The transpacitor 101 has a first conductive electrode 111, a semiconductor electrode 113 and a second conductive electrode 115. Transpacitor 103 has a first electrode 121, a semiconductor electrode 123 and a second conductive electrode 125. The two semiconductor electrodes 113 and 123 are joined by a low-resistance ohmic connection 117. One of the semiconductor electrodes 113 is made of p-type material, while the adjoining semiconductor electrode 123 is made of n-type material. The conductive electrodes 115 and 125 are connected to voltage sources capable of generating ramp voltages of the type shown in FIGS. 4a and 4b. A positive-going ramp source is shown to be connected to conductive electrode 115 while a negative-going ramp is shown to be connected to conductive electrode 125. The d.c. levels of the ramps are adjusted such that at the start of the ramps the semiconductor electrodes 113 and 123 are in a charge-accumulated condition. This means that current flowing between the ramp supplies flows principally through the semiconductor materials 113 and 123. Ramp voltage transitions faster than the RC transmission line rate, previously mentioned, will cause displacement current in the dielectric electrodes to penetrate through the transpacitors and that current will pass between input terminal 105 and output terminal 107 but will not interfere with the basic inverter properties.

A first desired instability mechanism that affects the operation of the circuit results from the side-by-side connection of the semiconductor electrodes 113 and 123. If the current flowing out of the output terminal 107 and of any input current through terminal 105 is ignored, the current through the semiconductor electrodes 113 and 123 must be the same. If the starting capacitance values of the transpacitors are equal, based on matched manufacture of the two devices, the output voltage remains at zero during the run of the ramps. A shift of bias levels, or application of an input signal, will yield unequal capacitor values causing one semiconductor layer to deplete out a little more, while the other depletes less. This unbalanced condition feeds on itself and results in a shift of the output terminal to a measurable signal. This instability permits a small input voltage to be magnified at the output.

Further as the ramp voltage progresses, the transpacitors deplete more and more, so that displacement current will intentionally pass through the input link with increasing amplitude which translates into increasing output voltage at terminal 107. When the two ramp voltages simultaneously run, the output of the device at terminal 107 is a signal dependent upon depletion of one or the other of the semiconductor electrodes 113 and 123, the choice being made by the polarity of the input signal at terminal 105. The output signal has gain with respect to the input signal. The inverter of FIG. 11 is a high-speed switch, a pair of which can be combined to form a NOR gate, as illustrated in FIG. 12.

With respect to FIG. 12, two inverters of the type illustrated in FIG. 11 are shown to be connected back-to-back. There is a pair of input terminals 131 and 133, a pair of terminals for applying positive and negative-going ramp voltages 134 and 137 and an output terminal 139. Each of the transpacitors has an electrode structure as described with reference to FIG. 11, with the oxide layers not being shown. The NOR gate operates as illustrated by the following example: When the signal applied to terminal 131 is negative and the input applied to terminal 133 is positive, the semiconductor layers 135 and 136 will deplete before semiconductor layers 137 and 138. Output terminal 139 will not respond because of balanced opposed inversions. However, if the areas of semiconductor electrodes 136 and 137 are larger than semiconductor electrodes 135 and 138, the inversions will not balance and a positive output will occur. The same applies when terminal 131 is positive and terminal 133 is negative. A negative input on both terminals will also produce a positive output. It is only when both input terminals are positive that the slightly unequal areas of electrodes 136 and 137 with respect to electrodes 135 and 138 must be overcome by a somewhat higher input. When that is achieved a NOR gate with the state table shown in FIG. 13 will be obtained. The alternate output states are obtained by making the areas of semiconductor electrodes 136 and 137 smaller instead of larger than semiconductor electrodes 135 and 138.

Figure 14:
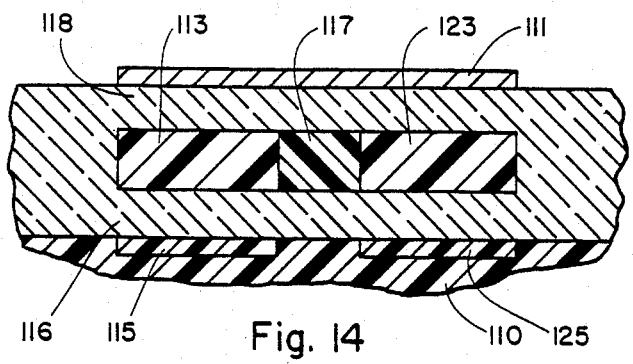
FIG. 14 is a cross-sectional view of an inverter construction, following the inverter schematic illustrated in FIG. 11.

FIG. 14 shows a side view for the inverter construction of the device of FIG. 11. The first conductive electrodes, 115 and 125 are shown to be heavily doped n-type regions within lightly doped p-type bulk semiconductor material. Above these two conductive electrodes is an oxide or nitride layer 116 over which a semiconductor electrode layer is disposed for defining semiconductor electrodes 113 and 123. The ohmic contact region 117 of heavily doped semiconductor material is between these layers. A second oxide or nitride layer 118 is disposed over the semiconductor layer, with a metal layer 111 defining plural conductive electrodes disposed on top of the structure.

Figure 15:
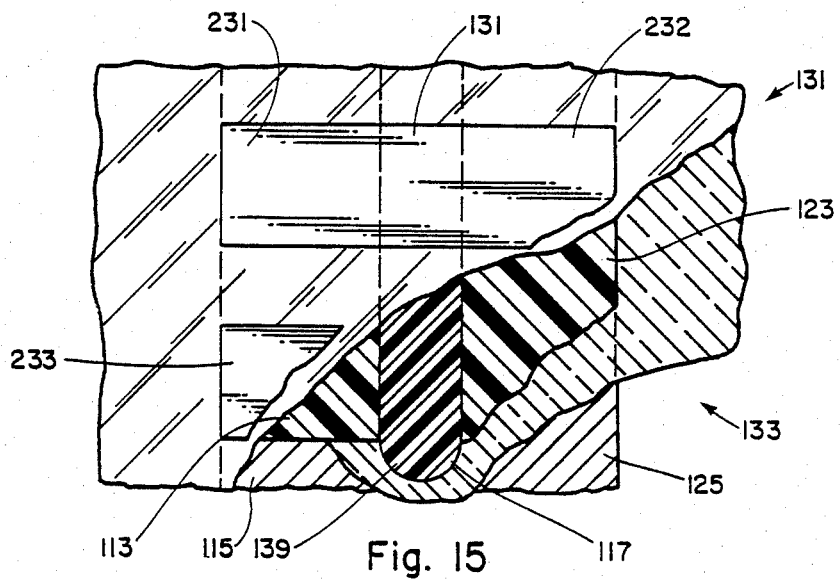
FIG. 15 is a top view of a pair of inverters of the type illustrated in FIG. 14, forming a NOR gate.
Figures 16, 17:
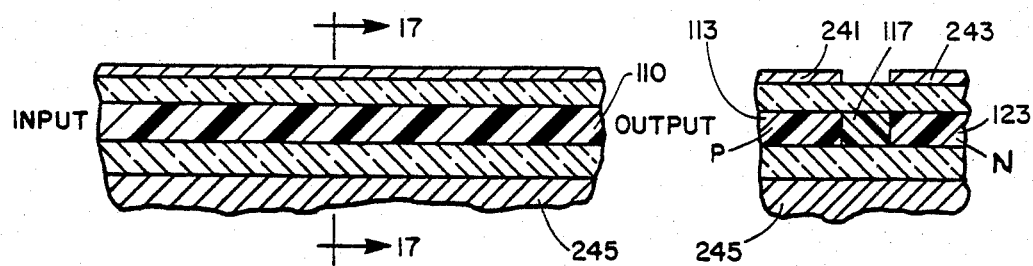
FIG. 16 is a side view of a transpacitor transmission line for interconnecting different devices on a circuit chip.
FIG. 17 is a view taken along lines 17—17 in FIG. 16.

The top view of FIG. 15 illustrates how two output-connected transpacitor inverters, forming a NOR gate, might appear; one input terminal, 131, would have the two connected upper conductive electrodes 231 and 232, while the second input terminal 133 would have the two connected upper conductive members 233, 234, not shown. An ohmic conductive region 117 connects the semiconductor layer and provides an output terminal 139 so that two inverters may be connected in the manner illustrated in FIG. 12.

Where an inverter of the type shown in FIG. 11 is stretched, a transmission line is formed as shown in FIGS. 16 and 17. A pair of ramp buses 241 and 243 are conductive electrodes upon which ramp voltages are applied. The central semiconductor layer 110 has p- and n-regions 113 and 123 connected by an ohmic contact region 117. A lower conductive layer 245 serves as a ground plane forming an opposite electrode. The stretched-out geometry preserves charge and maintains capacitance values, allowing logic states to be preserved when interconnecting devices on a circuit chip. A transition front will travel along the transmission line from the input to the output having a magnitude and velocity determined by the device geometry. The length of the transmission line is limited by the velocity of the front and the length of time that ramp voltages can stay on before depletion of the semiconductor layer 110 occurs.

Figure 18:
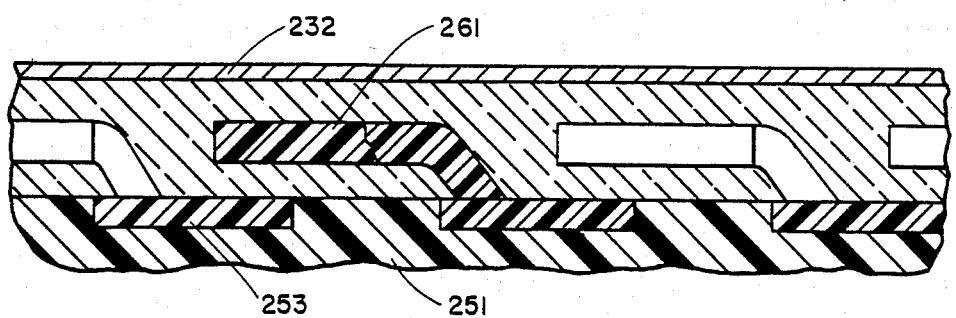
FIG. 18 is a side sectional view illustrating the connection of multiple transpacitor inverters of the type shown in FIG. 15.
Figure 19:
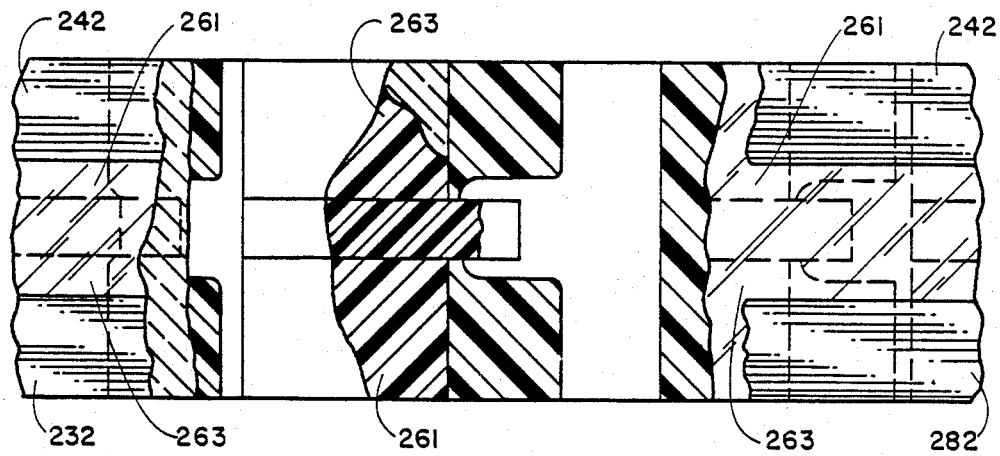
FIG. 19 is a top view of the construction shown in FIG. 18.

Interconnection between inverters to form a shift register or other logic circuit can be achieved by connecting the output of one to the input of the next, either by capacitive coupling or by direct ohmic connection. FIG. 18 shows the latter method wherein the ground plane of FIGS. 16 and 17 is a p-type bulk silicon wafer 251 into which n+ diffused regions 253 are placed in the manner of FIGS. 14 and 15. These regions act as the stage interconnects and input electrodes. By placing a series of stages with alternating n- and p-type regions, 261 and 263 respectively, as shown in FIG. 19, a single pair of ramp buses 232 and 242 can drive the whole shift register. The intrinsic stage delay caused by the RC transmission line effect noted before assists the proper coupling. Operation also depends upon the fact that when the voltage transitions of the ramps are applied in the voltage polarity opposite to that discussed in connection with FIGS. 3 and 4, none of the unstable behavior will occur. Thus every other stage in the shift register will be reset and be ready for a data bit upon the next transition in the direction of instability.

FIGS. 18 and 19 illustrate the manner of connecting a plurality of inverters of the type illustrated in FIG. 15 together in a single integrated circuit chip.

ELECTRICALLY ALTERABLE READ-ONLY MEMORY (EAROM) ARRAYS

The device configuration of an EAROM cell makes use of the topology of the transpacitor. By contrast, if a conventional MOSFET is used as a memory readout device, the signal path follows the current, namely in the plane of the layers making up the structure. In any memory, layout efficiency is the greatest virtue in any design. For a memory cell, a single lithographically defined feature that is isolated from its neighbors represents the ultimate density. The present cell makes an improvement over current practice. Because of its current flow direction, the MOSFET requires at least three such lithographically defined features plus additional ones for the attendant wiring connections and address lines. Transpacitor readout requires in principle only one isolated lithographic feature. The two inventive EAROM array considerations are: (1) transpacitor readout of charged and uncharged floating gate states and (2) means for charging and discharging the floating gates.

Figure 20:
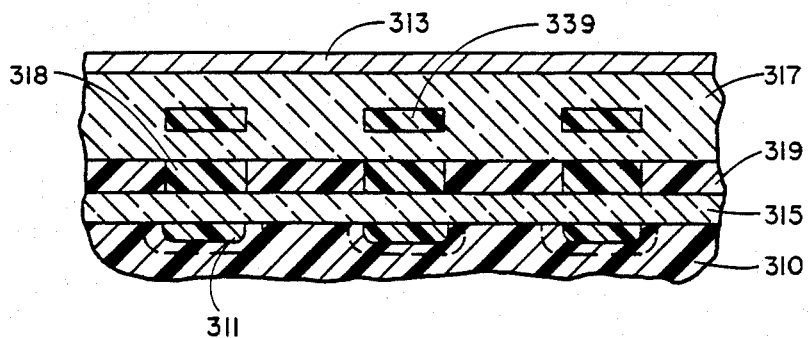
FIG. 20 is a side sectional view of a charge-sensitive read out transpacitor structure for use as a read-only memory (ROM) array.

Transpacitor readout of a matrix of floating gates is illustrated in FIG. 20. The array consists of a grounded aperture plate of heavily doped silicon 319 with lightly doped square apertures 318. Above each of these lies a floating gate 339 embedded in insulator 317, while above and below this combination there are orthogonally oriented matrix-address lines 311 and 313. The heavily doped n-type lines 311 in the lightly doped p-type silicon substrate 310 are diffused and the upper lines 313 are metal. As before, all layers are separated by insulator layers 315 and 317. Readout is accomplished by selecting a pair of matrix lines 311 and 313 and applying a varying voltage to the lower one (the source line) and measuring the response in the upper one (the sense line). If the floating gate 339 is uncharged, the transpacitor is in the blocking mode and no signal is transmitted. With a charge, the aperture 318 becomes depleted and transmission can take place. The chief competitive signal will be leakage around and through the aperture plate.

Figure 21:
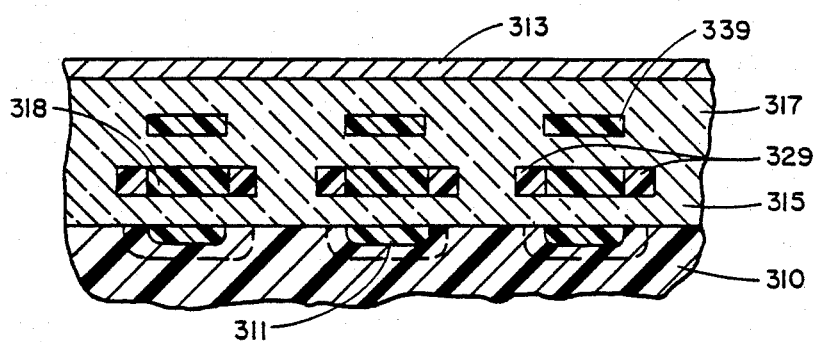
FIG. 21 is a side sectional view of an EAROM selection circuit construction for use with the array of FIG. 20.
Figure 22:
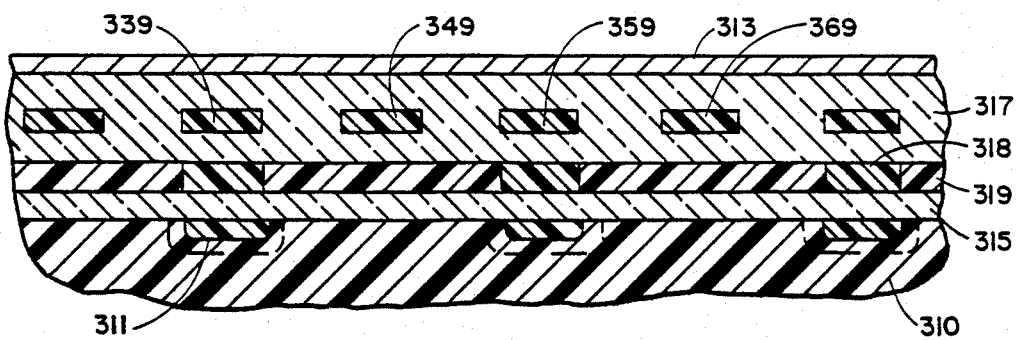
FIG. 22 is a side sectional view of an EAROM charging circuit for use with the array of FIG. 20.

A simple way of addressing a floating gate for the purpose of charging or discharging is shown in FIG. 21. The aperture plate is divided into lines 329 that run directly over the lines 311 in the substrate. During readout, these lines are all grounded and the operation is as before, but during the write and erase operations of the floating gate they are used to individually address a given element. For long lines in the aperture plate, considerable voltage drop will occur along their length and a false signal may occur in the sense line. Since this signal will vary with the distance along the line, the array size must be kept reasonable. An alternative charging method is given in FIG. 22 which shows that extra lines, charging lines, 349, 369 are inserted between the locations of the floating gates 339, 359 and that the aperture plate is left unsegmented. This continuous plane is much better able to handle the induced pickup from the source line because the current can spread laterally and thus avoid the voltage build up along its length. Charging and discharging are handled by selecting at one potential the sense line 339 and the charging line 349 on one side of the element and at the other potential the aperture plate 319 and the charging line 359 on the other side of the element. The other charging lines 369 are held at an intermediate potential to prevent selection of unwanted cells. The charging or discharging then takes a slanting route and the voltages will have to be selected carefully to perform the half-select function. Other geometries are also possible for the charging line, such as a line that has a hole for each floating gate and is oriented orthogonally to the sense lines. Selection of that line and a sense line would be all that is needed for the charging/discharging operation, but it would take more space in the layout. An added benefit of this structure, however, is an extra measure of shielding during readout if these lines are grounded at that time.

Lastly, it is possible to construct a one-element static random access memory using the construction indicated in FIG. 1, except having an extended longitudinal dimension with the input to the semiconductor electrode 19 being at opposite sides of a rectangle having short and long dimensions, with contact being made on the short side. Electrical contacts then are made at opposite sides of a rectangular plane in which the semiconductor layer 19 lies. One of the electrical contacts is for the purpose of sensing voltages on the layer, while the other contact is for the purpose of feeding an input signal, establishing the storage state of the device. In the situation where there is an a.c. signal on lower electrode 11, the signal can be readily sensed by the sensing electrode of semiconductor layer 19. The lower electrodes 11 would be formed as parallel lines in the X direction in order to form a memory array, while the voltage sensing terminals would be connected as wires forming a grid in a perpendicular direction, equally spaced apart with the rectangular semiconductor layers 19 at the intersections of the wires and the first electrodes. The lower electrodes 11, appearing as equally spaced lines in the X direction, which can be individually electrically excited are perpendicular to sensing lines in the the Y direction, which are the wires connected to the terminals 27, each of the wires being capable of being individually addressed. When two depletion layers are formed extending from each of the conductive layers 11 and 13 oppositely and toward each other, approaching semiconductor layer 19 the conductivity along the rectangular semiconductor layer 19 becomes very low and it becomes impossible to maintain the voltage condition on the semiconductor layer and there is then an inability to maintain any current flow in the layer. This leads to two-state voltage distribution. This distribution may be sensed by the wires attached to the terminal 27 in the Y direction.

States of the memory devices may be altered using electrode 13 as a writing electrode. When the electrode 13 is driven toward depletion of the semiconductor layer 19 a first state exists. In that state, the signal on the sensing electrode will be small. If the voltage on the writing gate, namely the electrode 13 is driven toward accumulation, the opposite state is induced. In that state, the output from the sensing electrode 27 will be large. There is a hysteresis effect in going between one state and the other state. This hysteresis effect is indicative of stability of the two states and is static such that the device remains at a given condition for an indefinite time, so long as power is applied.

I claim:

1. A three-terminal, two-port circuit element comprising,
   first and second spaced-apart conductive electrodes disposed in a capacitive relationship, the electrodes terminating in respective first and second electrical terminals,
   a semiconductor control electrode spaced between the first and second electrodes in a dielectrically insulated relation, the semiconductor control electrode connected to a third electrical terminal and having a thickness dimension such that two opposed depletion zones may be formed by electric fields in the semiconductor control electrode one proximate to each of the conductive electrodes, and
   voltage supply means connected to the first, second and third terminals for forming and controlling said two opposed depletion zones in the semiconductor control electrode so that they proximately approach and recede from each other corresponding to charge depletion and accumulation, two of the three terminals combined into each of two circuits forming input and output ports permitting a.c. current flow in circuits connected to said terminals.

2. The apparatus of claim 1 wherein said semiconductor control electrode has insulation consisting of oxide or nitride separating the semiconductor control electrode from the first and second conductive electrodes.

3. A three-terminal, two-port circuit element comprising,
   a first conductive layer having a major planar surface and a first electrical terminal,
   a second conductive layer having a major planar surface and a second electrical terminal, the second conductive layer spaced apart from the first conductive layer in a parallel-plate capacitive relationship,
   a semiconductor control layer spaced between the first and second conductive layers in a dielectrically insulated relation, the semiconductor control layer connected to a third electrical terminal and having an effective thickness such that two opposed depletion layers may be formed by electric fields in the semiconductor control layer, one proximate to each of the conductive layers, and
   voltage supply means connected to the first, second and third terminals for forming and controlling said two opposed depletion layers in the semiconductor control electrode so that they proximately approach and recede from each other corresponding to charge depletion and accumulation, two of the three terminals combined into each of two circuits forming input and output ports permitting a.c. current flow in circuits connected to said terminals.

4. The apparatus of claim 3 wherein said semiconductor control layer has first and second oxide or nitride layers spaced on opposite sides of the semiconductor control layer in contact therewith, forming a dielectric sandwich.

5. The apparatus of claim 4 wherein said dielectric sandwich is disposed between the first and second conductive layers in contact therewith.

6. The apparatus of claim 3 wherein said second conductive electrode is an upper layer of a device having a first conductive layer, a lower oxide layer on the conductive layer, a semiconductor layer on the lower oxide layer, an upper oxide layer on the semiconductor layer and a second conductive layer on the upper oxide layer, said second conductive layer partitioned into a first conductive member forming the second terminal and a second conductive member in said upper layer, insulated from the first conductive member, forming the third terminal, said second conductive member contacting the semiconductor layer.

7. A three-terminal, two-port circuit element comprising,
 a first conductive layer having a major planar surface and a first electrical terminal,
 a first dielectric layer disposed over the major surface of the conductive layer,
 a semiconductor control layer disposed over the first dielectric layer,
 a second dielectric layer disposed over the semiconductor layer,
 a second conductive layer having first and second mutually spaced and electrically distinct conductor members, at least one of which is disposed in a layer over the second dielectric layer, the first conductor member contacting the semiconductor layer, forming a third electrical terminal, the second conductor member forming a second electrical terminal, the semiconductor layer having an effective thickness such that opposed depletion zones may be formed therein, one zone associated with each of the first and second conductive layers,
 voltage supply means connected to the first, second and third terminals for forming and controlling said two opposed depletion layers in the semiconductor control electrode so that they proximately approach and recede from each other corresponding to charge depletion and accumulation, two of the three terminals combined into each of two circuits forming input and output ports permitting a.c. current flow in circuits connected to said terminals.

8. The apparatus of claims 3 or 7 forming a first device connected back-to-back with a second matched device, except of opposite polarity in the semiconductor layer, thereby forming a complementary device pair.

9. The matched complementary devices of claim 8 wherein said matched devices share common first terminals.

10. The matched devices of claim 8 wherein said matched devices share common third terminals.

11. The matched devices of claim 8 wherein said matched devices are connected to a bias voltage source comprising two approximately equalamplitude, opposite-polarity ramp voltages, each connected to one of the two second terminals.

12. A EAROM device comprising,
 a first conductive layer having a major planar surface and first electrical terminals,
 a first dielectric layer disposed over the major surface of the conductive layer,
 a segmented semiconductor control layer disposed over the first dielectric layer, the segments being lightly and heavily doped regions, the second electrical terminal connected to a heavily doped region,
 a second dielectric layer disposed over the semiconductor layer,
 a second conductive layer of floating gates disposed over the second dielectric layer and covered by a third dielectric layer,
 a third conductive planar layer disposed over the third dielectric layer, and having third electrical terminals, the semiconductor layer having an effective thickness such that opposed depletion zones may be formed therein, one zone associated with each of the first and second conductive layers, the lightly doped segments of the semiconductor control layer disposed in a capacitive relation between the first and second conductive layers and vertically aligned beneath the floating gates,
 voltage supply means connected to the first, second and third terminals for forming and controlling said two opposed depletion layers in the semiconductor control electrode so that they proximately approach and recede from each other corresponding to charge depletion and accumulation, whereby charge stored on the floating gates may be sensed in circuits connected to the electrical terminals.

13. A solid state inverter comprising,
(a) first and second matched three-terminal, two-port circuit elements, each three-terminal, two-port circuit element having,
 (i) first and second spaced-apart conductive electrodes disposed in a capacitive relationship, the electrodes terminating in respective first and second electrical terminals,
 (ii) a semiconductor control electrode spaced bewteen the first and second electrodes in a dielectrically insulated relation, the semiconductor control electrode connected to a third electrical terminal and having a thickness dimension such that two opposed depletion zones may be formed by electric fields in the semiconductor control electrode, one proximate to each of the conductive electrodes, the semiconductor type of a control electrode in one circuit element opposite in polarity to the semiconductor type of a control electrode in the other circuit element,
(b) first and second conductive links, the first link joining two conductive electrodes of said two different three-terminal circuit elements to a first signal port, the second link joining the two semiconductor control electrodes of the three-terminal circuit elements to a second signal port, and
(c) a pair of bias terminals connected to each of the two conductive electrodes not connected to the first link with bias voltages applied to said bias terminals for governing the signal amplitude between the first and second signal ports by means of charge depletion and accumulation in the control electrode as opposed depletion zones therein approach and recede from each other.

14. A solid state NOR gate comprising, two interconnected solid state inverters, each inverter comprising,
(a) first and second matched three-terminal, two-port circuit elements, each three-terminal, two-port circuit element having,
  (i) first and second spaced-apart conductive electrodes disposed in a capacitive relationship, the electrodes terminating in respective first and second electrical terminals,
  (ii) a semiconductor control electrode spaced between the first and second electrodes in a dielectrically insulated relation, the semiconductor control electrode connected to a third electrical terminal and having a thickness dimension such that two opposed depletion zones may be formed by electric fields in the semiconductor control electrode, one proximate to each of the conductive electrodes, the semiconductor type of a control electrode in one circuit element opposite in polarity to the semiconductor type of a control electrode in the other circuit element,
(d) first and second conductive links, the first link joining two conductive electrodes of said two different three-terminal circuit elements to a first signal port, the second link joining the two semiconductor control electrodes of the three-terminal circuit elements to a second signal port, and
(c) a pair of bias terminals connected to each of the two conductive electrodes not connected to the first link, with bias voltages applied to said bias terminals for governing the signal amplitude between the first and second signal ports by means of charge depletion and accumulation in the control electrode as opposed depletion zones therein approach and recede from each other,
the first conductive link of each inverter being an input node thereby forming two input nodes for logic signals, the second conductive link of each inverter being mutually connected in a single node forming a logic output node and the two pairs of bias terminals for the two inverters being connected to form a single pair of bias terminals.

15. A construction for a solid state inverter comprising,
  (a) a pair of coplanar first conductive electrodes disposed in an insulating body, electrically interconnected by a first conducting link,
  (b) a pair of parallel, coplanar second conductive electrodes disposed in a capacitive relationship with respect to the pair of first electrodes, each second electrode having a bias terminal connected thereto,
  (c) a pair of parallel, coplanar semiconductor control electrodes spaced between the first and second pairs of electrodes in a dielectrically insulated relation, but mutually connected by an ohmic contact, the control electrodes having a thickness dimension such that two opposed depletion zones may be formed therein, each proximate to a conductive electrode of opposed pairs of conductive electrodes, the semiconductor type of one control electrode opposite in polarity to the semiconductor type of the other control electrode, the ohmic contact forming a second conductive link between control electrodes and projecting outwardly beyond the lateral extent of the first and second pairs of conductive electrodes for access, the first and second conductive links forming respective first and second signal ports, and
  (d) a bias voltage means connected to the bias terminals for governing the signal amplitude between the first and second signal ports by means of charge depletion and accumulation in the control electrodes as the opposed depletion zones therein approach and recede from each other.

16. The inverter of claim 15 where the dimensions of the electrodes are stretched thereby forming a transmission line.

17. A series interconnection of two inverters of the kind described in claim 15 wherein the ohmic contact from one inverter extends outwardly to make contact with a first conductive electrode of a second inverter.

18. The series interconnection of claim 16 wherein the semiconductor type of successive control electrodes alternates between n- and p-type, thereby forming a shift register.

19. A construction for a solid state NOR gate comprising,
two interconnected solid state inverters, each inverter comprising,
  (a) a pair of parallel, copolanar first conductive electrodes disposed in an insulating body, electrically interconnected by a first conducting link,
  (b) a pair of parallel, coplanar second conductive electrodes disposed in a capacitive relationship with respect to the pair of first electrodes, each second electrode having a bias terminal connected thereto,
  (c) a pair of parallel, coplanar semiconductor control electrodes spaced between the first and second pairs of electrodes in a dielectrically insulated relation, but mutually connected by an ohmic contact, the control electrodes having a thickness dimension.such that two opposed depletion zones may be formed therein, each proximate to a conductive electrode of opposed pairs of conductive electrodes, the semiconductor type of one control electrode opposite in polarity to the semiconductor type of the other control electrode, the ohmic contact forming a second conductive link between control electrodes and projecting outwardly beyond the lateral extent of the first and second pairs of conductive electrodes for access, the first and second conductive links forming respective first and second signal ports, and
  (d) a bias voltage means connected to the bias terminals for governing the signal amplitude between the first and second signal ports by means of charge depletion and accumulation in the control electrodes as the opposed depletion zones therein approach and recede from each other,
the pairs of first, second and control electrodes being respectively coplanar, the two electrically interconnected pairs of first conductive electrodes each being an input, thereby forming two input terminals, the second conductive electrodes being mutually electrically connected in pairs such that each pair is proximate to a control electrode of the same semiconductor type, the ohmic contacts of the semiconductor control electrodes forming a mutual output terminal.

20. The construction of claim 19 having construction asymmetry means for selecting a desired truth table.

21. The construction of claim 20 wherein said construction asymmetry means comprises electrodes of slightly unequal areas.

* * * * *